(12) United States Patent
Kim et al.

(10) Patent No.: US 6,598,312 B2
(45) Date of Patent: Jul. 29, 2003

(54) WAFER DRYING APPARATUS

(75) Inventors: Tae-Ho Kim, Seoul (KR); Dong-Kwan Hong, Suwon (KR); Nung-Suck Kang, Osan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/101,955

(22) Filed: Mar. 21, 2002

(65) Prior Publication Data
US 2003/0009901 A1 Jan. 16, 2003

(30) Foreign Application Priority Data
Jul. 12, 2001 (KR) .......................................... 2001-41944

(51) Int. Cl.$^7$ ................................................ F26B 21/06
(52) U.S. Cl. ............................... 34/72; 34/448; 34/638; 34/630; 134/902
(58) Field of Search .......................... 34/444, 448, 467, 34/72, 630, 638, 636; 134/902, 61, 88

(56) References Cited

U.S. PATENT DOCUMENTS

| | | | |
|---|---|---|---|
| 5,369,891 A | | 12/1994 | Kamikawa ...................... 34/78 |
| 5,520,744 A | * | 5/1996 | Fujikawa et al. ........ 134/102.1 |
| 5,710,407 A | * | 1/1998 | Moore et al. ................ 118/725 |
| 6,029,371 A | | 2/2000 | Kamikawa et al. ............ 34/516 |
| 6,128,830 A | | 10/2000 | Bettcher et al. ............... 34/404 |
| 6,328,809 B1 | * | 12/2001 | Elsawy et al. .................. 134/1 |
| 6,413,355 B1 | * | 7/2002 | Kamikawa et al. .......... 438/745 |

* cited by examiner

Primary Examiner—Ira S. Lazarus
Assistant Examiner—Kathryn S. O'Malley
(74) Attorney, Agent, or Firm—Lee & Sterba, P.C.

(57) ABSTRACT

A wafer drying apparatus of increased efficiency in which isopropyl alcohol (IPA) supplied to a hood is activated by heat, thereby increasing its diffusion efficiency and enabling it to vaporize pure water on a wafer quickly, includes a washing tank for storing pure water, a hood positioned at an upper portion of the washing tank, an injection nozzle for ejecting IPA positioned in the hood, a storage tank for storing the IPA, a bubble maker in the storage tank to create IPA vapor, a nitrogen supplier for storing a carrier gas for transferring the IPA vapor in the storage tank to the hood, and a heater provided near the injection nozzle to heat the IPA vapor that is ejected through the injection nozzle to a predetermined temperature, thereby uniformly diffusing the IPA vapor.

7 Claims, 4 Drawing Sheets

WAFER DRYING APPARATUS

BACKGROUND OF THE INVENTION

1. Field of the Invention

The present invention relates to a wafer drying apparatus. More particularly, the present invention relates to a wafer drying apparatus in which a heater is provided at an injection nozzle that ejects isopropyl alcohol to a dry room, thereby activating the isopropyl alcohol in order to quickly dry pure water on a wafer.

2. Description of the Related Art

Generally, semiconductor devices are fabricated from wafers by utilizing various types of semiconductor fabricating apparatuses. During formation of semiconductor devices, impurities such as polymer, dust, various types of powders, etc. may remain on a wafer while the wafer is processed. Such impurities remaining on a wafer cause a decrease in semiconductor device manufacture yield. Consequently, a washing process for washing and drying the wafer is necessarily performed in order to remove the impurities.

At this time, pure de ionized water (DIW) is generally used for washing a wafer. Since pure water has a tendency to dissolve a wafer made of a silicon material, water spots are formed on the wafer shortly after washing in pure water. In order to prevent the formation of such water spots, wafers must be dried quickly after being washed in pure water.

The principal methods for drying wafers are a vapor dry method and a Marangoni dry method. The Marangoni method is based on a Marangoni principle wherein surface tension of a liquid phase material is used to dry a wafer. The Marangoni dry method has been widely used in various types of applications.

FIG. 1 illustrates a schematic diagram of a conventional wafer drying apparatus in which the Marangoni principle is applied. Referring to FIG. 1, the wafer drying apparatus comprises a washing tank 10, a hood 20, a storing tank 30, and a nitrogen supplier 40. The hood 20 supplies isopropyl alcohol (IPA) for drying a wafer (W) washed in the washing tank 10 wherein pure water is stored. The storing tank 30 is charged with a chemical (IPA) for drying a wafer. The nitrogen supplier 40 stores a carrier gas, i.e., nitrogen gas, for transferring the IPA from the storing tank 30 to an injection nozzle 21 of the hood 20. The hood 20 has a plurality of distributing pipes 22 formed at a bottom surface thereof for diffusing IPA on the wafer.

Operation of the apparatus as constructed will now be described with reference to FIGS. 1 and 2. The wafer (W) is first washed in the washing tank 10. The washed wafer is lifted to a dry room 11 by a lifter 12 to be dried therein. When the wafer (W) is transferred to the dry room 11 and secured therein, IPA vapors are created by a bubble maker 31 contained in the storing tank 30.

The IPA vapor is transferred to the hood 20 via first, second, and third pipes P1, P2, and P3, respectively, by the carrier gas from the storing tank 40 and ejected to the dry room 11 through the injection nozzle 21. At this time, the ejected IPA vapor is uniformly distributed in the dry room 11 and the wafer (W) in the dry room 11 is dried by the Marangoni principle.

However, there is a problem with this conventional method in that the IPA supplied to the wafer is at room temperature and therefore cannot dry the wafer quickly enough to prevent formation of water spots on the wafer. Particularly, such a wafer drying method is not able to properly cope with a situation in which a wafer is going to be diametrically enlarged because more water spots are formed on the wafer as the wafer is enlarged.

SUMMARY OF THE INVENTION

To solve a problem as described above, it is a feature of an embodiment of the present invention to provide a more efficient wafer drying apparatus in which isopropyl alcohol (IPA) supplied to a hood is activated by heating, thereby increasing its diffusion efficiency in the hood and allowing it to quickly vaporize pure water on a wafer.

It is another feature of an embodiment of the present invention to provide a more efficient wafer drying apparatus that is capable of coping with a situation in which a diameter of a wafer is enlarged and the wafer is highly integrated, while maintaining an improved drying efficiency.

In order to achieve the above features of the present invention, a wafer drying apparatus is provided, including: a washing tank for storing pure water; a hood positioned at an upper portion of the washing tank; an injection nozzle for ejecting IPA positioned in the hood; a storage tank for storing the IPA; a bubble maker in the storage tank to create IPA vapor; a nitrogen supplier for storing a carrier gas for transferring the IPA vapor in the storage tank to the hood; and a heater provided near the injection nozzle to heat the IPA vapor that is ejected through the injection nozzle to a predetermined temperature, thereby uniformly diffusing the IPA vapor.

BRIEF DESCRIPTION OF THE DRAWINGS

The foregoing and other features, aspects and advantages of the present invention will be readily apparent to those of ordinary skill in the art upon review of the detailed description that follows with reference to the accompanying drawings in which.

DETAILED DESCRIPTION OF THE INVENTION

Figure 1:
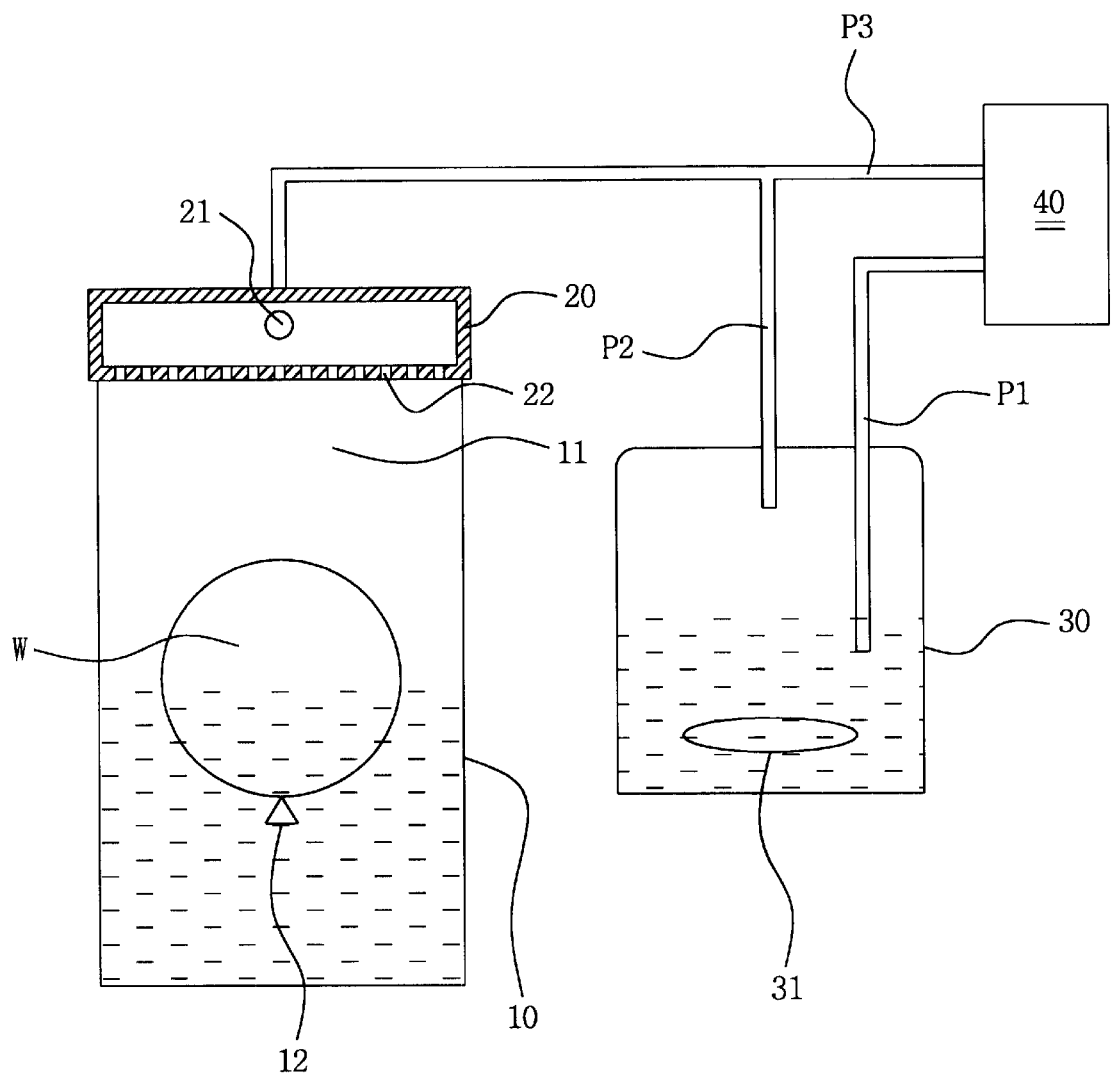
FIG. 1 illustrates a schematic diagram of a conventional wafer drying apparatus.
Figure 2:
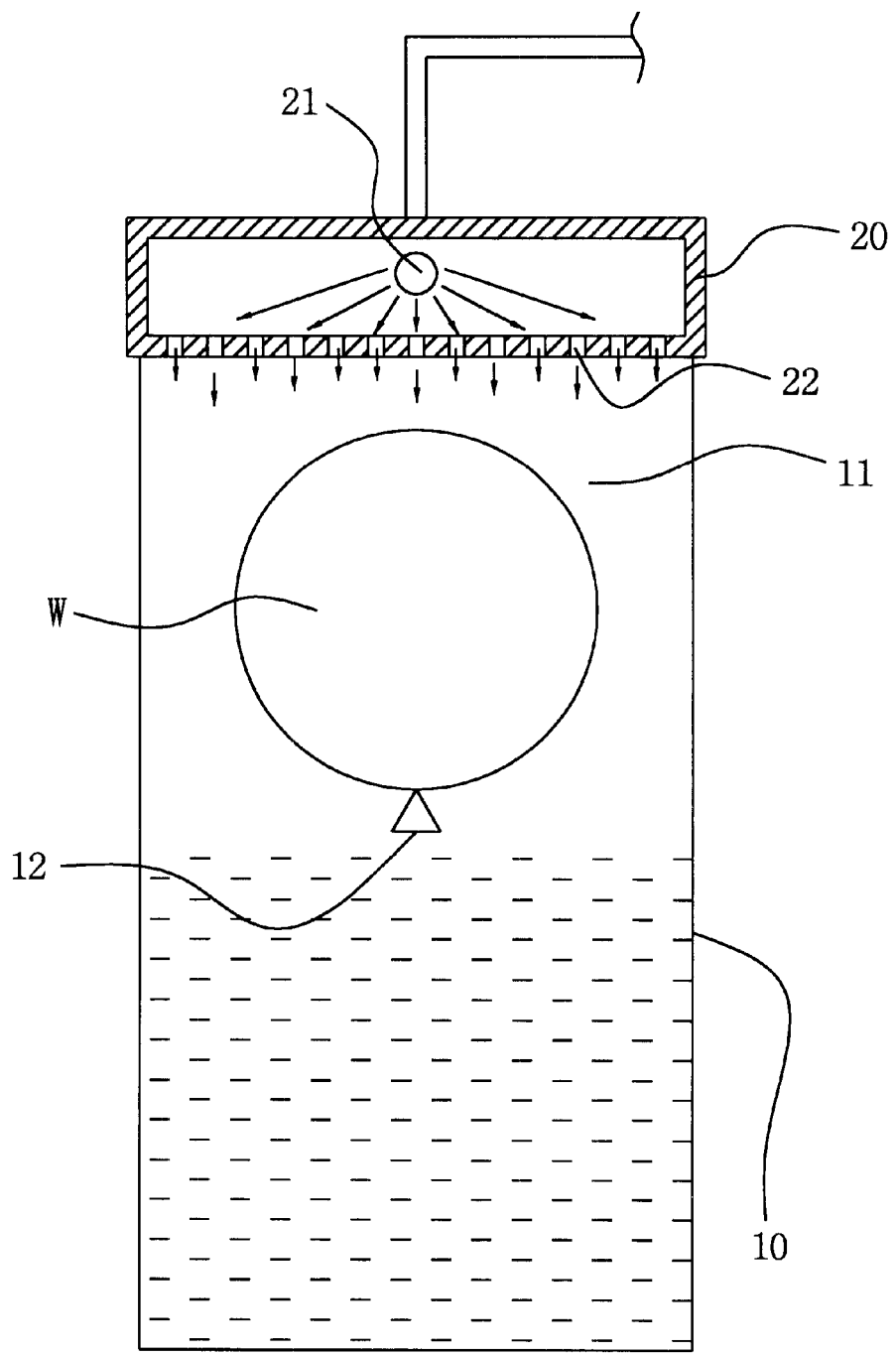
FIG. 2 illustrates a schematic diagram of an operation of the conventional wafer drying apparatus.

Korean Patent Application Number 2001-41944, filed on Jul. 12, 2001, and entitled: "Wafer Drying Apparatus," is incorporated by reference herein in its entirety.

Hereinafter, preferred embodiments of the present invention will be described in detail with reference to the accompanying drawings. In the drawing figures, like reference numerals refer to like elements throughout.

Figure 3:
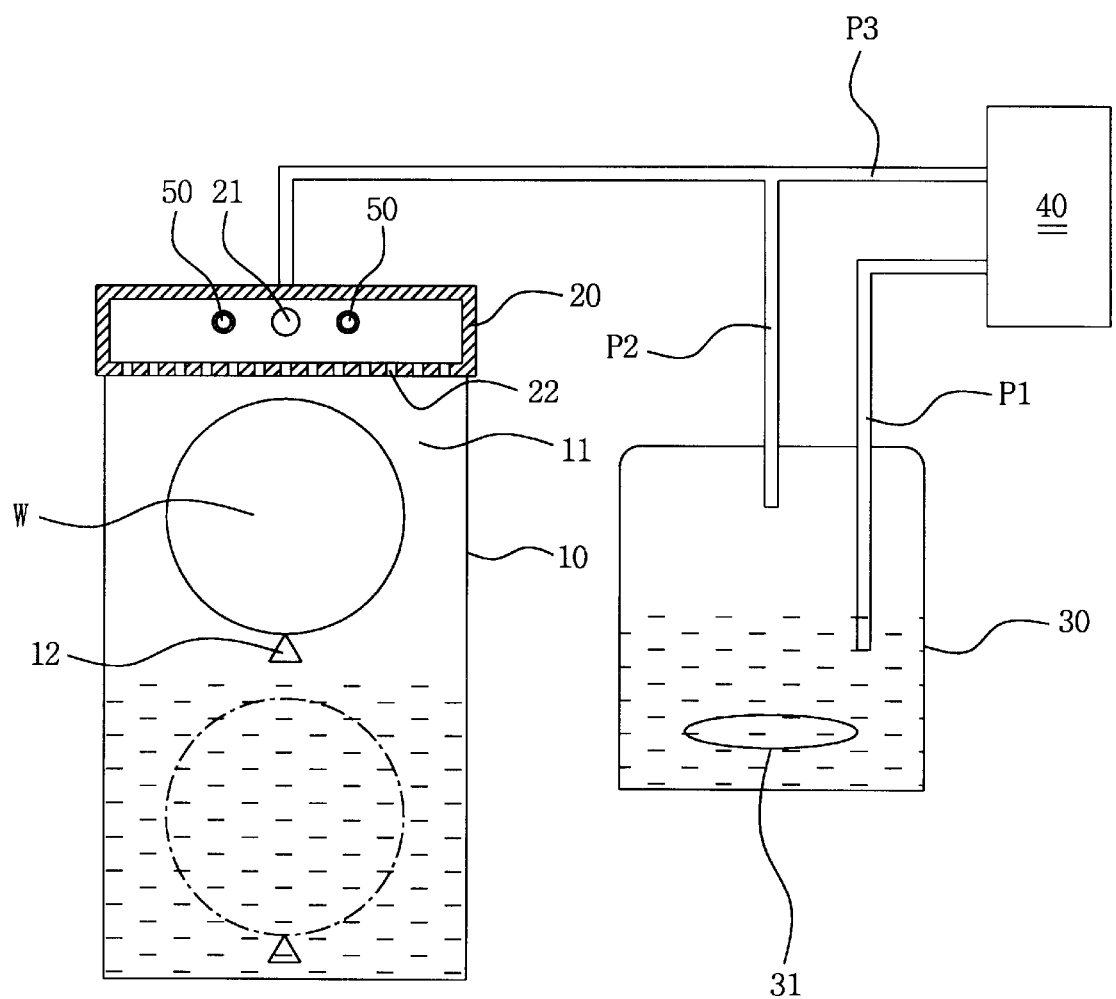
FIG. 3 illustrates a schematic diagram of a wafer drying apparatus according to the present invention.

Referring to FIG. 3, the wafer drying apparatus comprises a washing tank 10, a hood 20, a storing tank 30, a nitrogen supplier 40 and a heater 50. The washing tank 10, hood 20, storage tank 30 and nitrogen supplier 40 are similar in structure to that of the conventional wafer drying apparatus. More particularly, the hood 20, which is provided at an upper portion of the washing tank 10, supplies isopropyl alcohol (IPA) for drying a wafer (W) washed in the washing tank 10 in which pure water is stored. The storing tank 30 is charged with a chemical (IPA) for drying a wafer. A bubble maker 31 for creating IPA vapor is provided in the storing tank 30.

A dry room 11 is provided at an upper portion of the washing tank 10, and a lifter 12 is provided in the washing tank 10 for lifting a wafer (W). The nitrogen supplier 40 stores a carrier gas, i.e., nitrogen gas, for transferring the IPA from the storing tank 30 to an injection nozzle 21 provided in the hood 20. The injection nozzle 21 ejects the IPA into the washing tank 10.

The hood 20 has a plurality of distributing pipes 22 formed at a bottom surface thereof in a hole shape so that the IPA ejected from the injection nozzle 21 is uniformly diffused on a wafer (W) in the washing tank 10.

In a structure such as the conventional wafer drying apparatus, the IPA that is vaporized by the bubble maker 31 is ejected through the injection nozzle 21 in the hood 20 via first, second, and third pipes P1, P2, P3, respectively, that are connected between the storage tank 30 and the hood 20.

Figure 4:
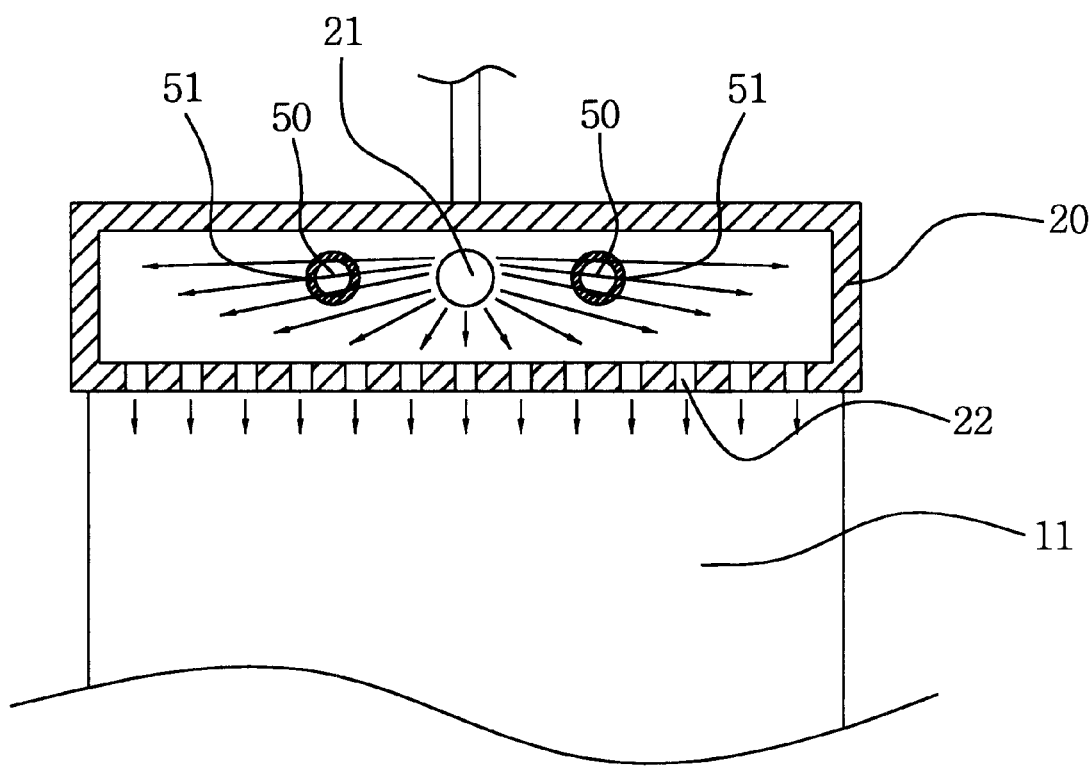
FIG. 4 illustrates an enlarged cross-sectional view of a hood of the wafer drying apparatus according to the present invention.

A main feature of the present invention is that a heater 50 is provided near the injection nozzle 21 of the hood 20 for heating the IPA. It is preferable that the heater 50 be a lamp type heater such as a UV lamp. In addition, it is preferable that the heater 50 be covered by a quartz material 51 as shown in FIG. 4., in order to prevent a fire. It is also preferable that one or more heaters 50 are provided to surround the injection nozzle 21. It is also preferable that the heater 50 be operated for approximately 1–5 minutes before the IPA is ejected from the distributing pipes 22, and that each of the heaters 50 radiate a heat value of approximately 500 W–3 KW.

FIG. 4 illustrates an enlarged cross-sectional view of the hood 20 and the drying room 11 according to an embodiment of the present invention.

Operation of the wafer drying apparatus will now be described with reference to FIGS. 3 and 4. A wafer (W) is washed by pure water and is lifted by lifter 12 to the dry room 11, as in the conventional apparatus. The drying process is performed when the wafer is secured in the dry room 11. At this time, the heater 50 in the hood 20 is driven to heat an interior of the hood 20 to a temperature of approximately 60° C. for a predetermined time.

Bubble maker 31 in the storage tank 30 creates IPA vapor. The IPA vapor is transferred to the injection nozzle 21 by a carrier gas that is supplied from the nitrogen supplier 40 via the first and second pipes P1, P2. Since the transferring power of the IPA vapor is weak when the IPA vapor is transferred to the injection nozzle 21 through only the second pipe P2, the third pipe P3 is connected to the second pipe P2 so that the IPA vapor is strongly and safely transferred to the injection nozzle 21.

The IPA vapor is ejected into the hood 20 through the injection nozzle 21 by the injection power of the carrier gas. At this time, heater 50 located near the injection nozzle 21 has already heated the inner side of the hood 20.

The wafer that is washed in the washing tank and positioned in the dry room 11 is first dried by the heat radiated from the heater 50 through the holes formed in the distributing pipes 22 before the IPA vapor reaches the injection nozzle 21. When the IPA vapor is ejected into the hood 20 from the injection nozzle 21, the IPA vapor is heated quickly—within approximately 40 seconds. The IPA vapor is thereby more actively vaporized, resulting in an increase in its diffusion efficiency in the hood 20.

As described above, the formation of water spots on a wafer may be prevented by the present invention because heating of the interior of the hood 20 by the heater 50 allows the wafer (W) to begin being dried immediately upon being lifted into the dry room 11. Furthermore, activation of the IPA vapor by the heat in the hood 20 prior to being sprayed on a wafer (W) after the wafer (W) is first dried by the heat in the hood 20 maximizes the Marangoni effect, thereby further improving the drying efficiency.

A preferred embodiment of the present invention has been disclosed herein and, although specific terms are employed, they are used in a generic and descriptive sense only and not for the purpose of limitation. Accordingly, it will be understood by those of ordinary skill in the art that various changes in form and details may be made without departing from the spirit and scope of the invention as set forth in the following claims.

What is claimed is:

1. A wafer drying apparatus comprising:
a washing tank for storing pure water;
a dry room positioned at an upper portion of the washing tank;
a hood positioned above the dry room at an upper portion of the washing tank, the hood having a plurality of distributing pipes formed at a bottom surface thereof;
an injection nozzle positioned in the hood for ejecting isopropyl alcohol into the hood;
a storage tank for storing the isopropyl alcohol;
a bubble maker in the storage tank to create isopropyl alcohol vapor;
a nitrogen supplier for storing a carrier gas for transferring the isopropyl alcohol vapor in the storage tank to the hood; and
a heater provided near the injection nozzle in the hood to heat the isopropyl alcohol vapor that is ejected through the injection nozzle to a predetermined temperature, thereby uniformly diffusing the isopropyl alcohol vapor through the disturbing pipes, and to heat the wafer in the dry room prior to injection of the isopropyl alcohol vapor.

2. The wafer drying apparatus as claimed in claim 1, wherein the heater is a lamp type heater.

3. The wafer drying apparatus as claimed in claim 2, wherein the heater is a UV lamp.

4. The wafer drying apparatus as claimed in claim 1, wherein the heater is covered by a quartz material.

5. The wafer drying apparatus as claimed in claim 1, wherein more than one heater is provided to surround the injection nozzle.

6. The wafer drying apparatus as claimed in claim 1, wherein the heater is operated for approximately 1–5 minutes before the isopropyl alcohol is ejected from the distributing pipes.

7. The wafer drying apparatus as claimed in claim 1, wherein the heater radiates a heat value of approximately 500 W–3 KW.

* * * * *